(12) United States Patent
Lu

(10) Patent No.: US 11,302,644 B2
(45) Date of Patent: Apr. 12, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaoshiung (TW)

( * ) Notice: Subject to any disclaimer, the term of this patent is extended or adjusted under 35 U.S.C. 154(b) by 99 days.

(21) Appl. No.: 16/732,166

(22) Filed: Dec. 31, 2019

(65) Prior Publication Data

US 2021/0202393 A1 Jul. 1, 2021

(51) Int. Cl.
*H01L 23/538* (2006.01)
*H01L 21/56* (2006.01)
*H01L 25/00* (2006.01)
*H01L 23/00* (2006.01)

(52) U.S. Cl.
CPC ........ *H01L 23/5386* (2013.01); *H01L 21/568* (2013.01); *H01L 24/16* (2013.01); *H01L 24/48* (2013.01); *H01L 24/73* (2013.01); *H01L 24/92* (2013.01); *H01L 25/50* (2013.01); *H01L 2224/16148* (2013.01); *H01L 2224/16238* (2013.01); *H01L 2224/48145* (2013.01);
(Continued)

(58) Field of Classification Search
CPC ... H01L 25/50; H01L 25/0657; H01L 25/105; H01L 24/73; H01L 21/568; H01L 2224/73257; H01L 23/5226; H01L 23/5386; H01L 2224/73207; H01L 2224/48137; H01L 24/16; H01L 24/48; H01L 25/0655; H01L 2924/14; H01L 24/92; H01L 2224/48145; H01L 2224/16238; H01L 2224/92247; H01L 23/5221; H01L 23/5381; H01L 2224/16145; H01L 2224/92163
See application file for complete search history.

(56) References Cited

U.S. PATENT DOCUMENTS

| | | | |
|---|---|---|---|
| 2010/0327424 A1* | 12/2010 | Braunisch | H01L 25/0655 257/692 |
| 2019/0096851 A1* | 3/2019 | Liao | H01L 24/96 |
| 2020/0212006 A1* | 7/2020 | Chang | H01L 25/50 |

* cited by examiner

*Primary Examiner* — Jasmine J Clark
(74) *Attorney, Agent, or Firm* — Foley & Lardner LLP

(57) ABSTRACT

A package structure includes a substrate, a first electronic component, a second electronic component, a third electronic component and a connection component. The substrate includes a first surface and a second surface opposite the first surface. The first electronic component is disposed at the substrate and has a first active surface exposed from the second surface of the substrate. The second electronic component includes a second active surface facing the first active surface of the first electronic component. The second active surface of the second electronic component is electrically connected to the first active surface of the first electronic component. The third electronic component includes a third active surface facing the first active face of the first electronic component. The connection component electrically connects the third active surface of the third electronic component to the first active surface of the first electronic component. The connection component has at least two bendings.

20 Claims, 25 Drawing Sheets

(52) U.S. Cl.
CPC ............... *H01L 2224/48225* (2013.01); *H01L 2224/73207* (2013.01); *H01L 2224/92163* (2013.01)

SEMICONDUCTOR PACKAGE STRUCTURE AND METHOD FOR MANUFACTURING THE SAME

BACKGROUND

1. Field of the Disclosure

The present disclosure relates to semiconductor package structure and methods thereof manufacturing the same.

2. Description of the Related Art

For the purpose of minimizing the package size, reducing power loss and providing higher I/O, bridge dies are generally used to connect ICs. The bridge die may connect to two adjacent semiconductor dies by copper pillars. The minimum distance from a die edge to a copper pillar disposed on the die is about 10 μm. Therefore, even if the two semiconductor dies are closely adjacent to each other, the minimum distance between a copper pillar on one semiconductor die and a copper pillar on the other semiconductor die would be at least 20 μm. To match such distance, the size of the bridge die has to be larger and the pad pitch of the bridge die has to be designed case by case. Additionally, a minimum distance between the two adjacent semiconductor dies is specified to facilitate the filling of a molding compound. In addition, due to the error and tolerance of the pick and place machines and the vacuum jigs, the distance between the two adjacent semiconductor dies should be larger, which leads to a much larger bridge die and further increases the cost of manufacturing a bridge die.

SUMMARY

In some embodiments, the present disclosure provides a package structure. The package structure includes a substrate, a first electronic component, a second electronic component, a third electronic component and a connection component. The substrate includes a first surface and a second surface opposite the first surface. The first electronic component is disposed at the substrate and has a first active surface exposed from the second surface of the substrate. The second electronic component includes a second active surface facing the first active surface of the first electronic component. The second active surface of the second electronic component is and electrically connected to the first active surface of the first electronic component. The third electronic component includes a third active surface facing the first active face of the first electronic component. The connection component electrically connects the third active surface of the third electronic component to the first active surface of the first electronic component. The connection component has at least two bendings.

In some embodiments, the present disclosure provides a package structure. The package structure includes a substrate, a first electronic component, a second electronic component, a third electronic component and a connection component. The substrate includes a first surface and a second surface opposite the first surface. The first electronic component is disposed at the substrate and has a first active surface exposed from the second surface of the substrate. The second electronic component includes a second active surface facing the first active surface of the first electronic component. The second active surface of the second electronic component is electrically connected to the first active surface of the first electronic component. The third electronic component includes a third active surface facing the first active face of the first electronic component. The connection component electrically connects the third active surface of the third electronic component to the first active surface of the first electronic component. The first electronic component includes a plurality of pads on the first active surface of the first electronic component. A horizontal distance between the second electronic component and the third electronic component is larger than a pad pitch of the first electronic component.

In some embodiments, the present disclosure provides a method for manufacturing a package structure. The method includes providing a substrate, disposing a second electronic component on the substrate, connecting the second active surface of the second electronic component and the first active surface of the first electronic component using a bonding wire, flipping the second electronic component and electrically connecting the second electronic component to the substrate, and disposing a third electronic component on the substrate. The substrate includes a first surface and a second surface opposite the first surface. The substrate includes a first electronic component disposed at the substrate and the first electronic component has a first active surface exposed from the second surface of the substrate. The second electronic component has a second active surface and the second active surface of the second electronic component faces away from the second surface of the substrate. The third electronic component has a third active surface facing the first active surface of the first electronic component and electrically connected to the first active surface of the first electronic component.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

Figure 1:
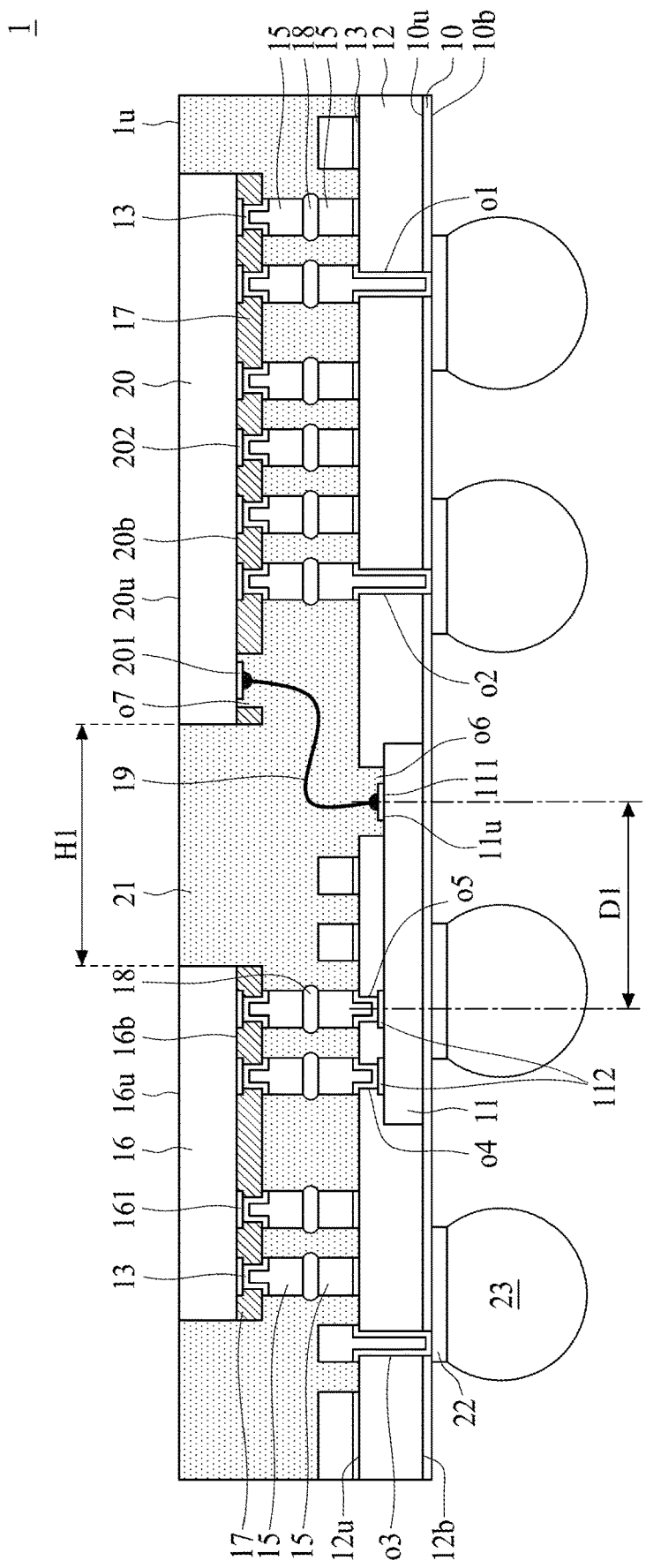
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

In the embodiments of the present disclosure, a connection component (e.g., a bonding wire or an RDL) is used to connect a pad of a bridge die to a pad of the ICs. Compared to the comparative techniques using copper pillars to connect the bridge die to the ICs, the connection component according to the present disclosure provides an alternative and flexible solution for electric connection, so the bridge die and the ICs can be connected without increasing the size of the bridge die and the pad pitch of the bridge die needs not to be further designed. In some embodiments, the distance of two ICs can be larger than the pad pitch of the bridge die (which refers to a distance between a pad of the bridge die connecting to one of the ICs and a pad of the bridge die connecting to the other of the ICs), which solves the difficulty to fill a molding compound but without increasing the size of the bridge die.

FIG. 1 illustrates a cross-sectional view of a package structure 1 according to some embodiments of the present disclosure. The package structure 1 includes a substrate 12, electronic components 11, 16 and 20, and a connection component 19.

The substrate 12 has a surface 12u and a surface 12b opposite to the surface 12u. The substrate 12 may be a dielectric layer. The dielectric layer may include organic materials (e.g., a molding compound, a polyamide (PA), a polyimide (PI), a polybenzoxazole (PBO), or an epoxy-based material) and/or inorganic materials (e.g., SiOx, SiNx, TaOx). The substrate 12 may cover the electronic component 11 as shown in FIG. 1. In some embodiments, an insulation layer 10 may be disposed on the surface 12b of the substrate 12. The insulation layer 10 has a surface 10b and a surface 10u opposite to the surface 10b. The insulation layer 10 may include, or be formed from, a dielectric material as defined above, for example, a polyimide (PI), a solder resist layer.

Openings O1 to O6 may be formed in the substrate 12 so as to manufacture conductive vias for electrical connections. Openings O1 to O3 may penetrate from the surface 12u of the substrate 12 to the surface 12b of the substrate 12 (or to the surface 10b of the insulation layer 10 if the insulation layer is present). Openings O4 to O6 may penetrate from the surface 12u of the substrate 12 to the electronic component 11 to expose the pads of the electronic component 11. A seed layer 13 is disposed on the surface 12u of the substrate 12 and in the openings O1 to O5 for manufacturing conductive vias, pillars or bumps to provide electrical connection.

The electronic component 11 is disposed at the substrate 12. For example, in the embodiments as shown in FIG. 1, the electronic component 11 may be fully embedded within the substrate 12 and expose a portion of the active surface 11u of the electronic component 11 and a pad 111 thereon from the surface 12u of the substrate 12. In some other embodiments, the electronic component 11 may be partially embedded within the substrate 12 so that the active surface 11u of the electronic component 11 is not covered by the substrate 12 (e.g., fully exposed from the surface 12u of the substrate 12). In some other embodiments, the electronic component 11 may be disposed on or in direct contact with the surface 12u of the substrate 12 so the active surface 11u of the electronic component 11 is fully exposed from the surface 12u of the substrate 12.

The electronic component 11 has an active surface 11u. The electronic component 11 includes a plurality of pads 111 and 112 on the active surface 11u. At least a portion of the active surface 11u are exposed from the surface 12u of the substrate 12, for example, from the opening O6 and the pads 111 located on the exposed surface is also exposed.

The electronic component 16 has an active surface 16b and a surface 16u opposite to the active surface 16b. The active surface 16b faces the active surface 11u of the first electronic component 11. Pads 161 are disposed on the active surface 16b of the electronic component 16. An insulation layer 17 is disposed on the active surface 16b. The insulation layer 17 surrounds the pads 161 and may cover a portion (e.g., a peripheral portion) of the pads 161. The active surface 16b of the electronic component 16 is electrically connected to the active surface 11u of the electronic component 11, for example, by using a pillar 15 connecting a pad 161 on the active surface 16b of the electronic component 16 to a pad 112 on the active surface 11u of the electronic component 11.

As shown in FIG. 1, the pillar 15 may include a first portion and a second portion. The first portion and the second are connected to each other at an end of each portion by an adhesive layer 18 disposed therebetween. In some embodiments, the adhesive layer 18 may include solder paste. The adhesive layer 18 also may be considered to be a part of the pillar 15. The other ends of the first portion and the second portions may be electrically connected to the electronic components 11, 16 or 20 or the substrate 12. In some embodiments, the other ends of the first portion and the second portions may be electrically connected to the pad 161 on the active surface 16b of the electronic component 16 and the pad 112 on the active surface 11u of the electronic component 11, respectively. A seed layer 13 may be disposed between the pillar and the pad. The seed layer 13 also may be considered to be a part of the pillar 15. In some embodiments, the pillar 15 may include copper. However, other conductive material such as nickel and/or aluminum or a combination of various metals or other conductive materials may also be used in the pillar 15.

The electronic component 20 has an active surface 20b and a surface 20u opposite to the active surface 20b. The active surface 20b faces the active surface 11u of the first electronic component 11. The pads 201 and 202 are disposed on the active surface 20b. The insulation layer 17 is formed on the active surface 20b. The insulation layer 17 surrounds the pads 202 and may cover a portion (e.g., a peripheral portion) of the pads 202. The insulation layer defines an opening O7. At least a portion of the active surface 20b are exposed from the opening O6 and the pads 201 located on the exposed surface is also exposed.

The connection component 19 may electrically connect, or in direct contact with, a pad, a bump or a pillar disposed on the active surface 11u of the electronic component 11 and a pad, a bump or a pillar disposed on the active surface 20b of the electronic component 20. In the embodiments shown in FIG. 1, the connection component 19 electrically connects, or in direct contact with, the pad 111 on the active surface 11u of the electronic component 11 and the pad 201 on the active surface 20b of the electronic component 20. The connection component 19 has at least two bendings.

In some embodiments, the connection component 19 includes at least one bonding wire or a redistribution layer (RDL). The at least one bonding wire has at least two bendings as shown in FIG. 1. The RDL includes one or more patterned conductive layers and one or more conductive vias to provide fan-out routing. The RDL includes at least two bendings formed by the junction of the patterned conductive layer and the adjacent conductive vias.

In some embodiments, the electronic component 16 or the electronic component 20 may connect to the substrate 12 by the pillar 15. The pillars may be electrically connected to pads or traces on the surface 12u of the substrate or serve as a dummy pillar to provide a support for the electronic component 16 or 20 rather than provide electrical connection. In addition, the pillar 15 may contact the conductive vias formed in the openings, e.g., O1, O2, O3, O4 or O5 to provide electrical connections. For example, as shown in FIG. 1, the electronic component 20 may be electrically connected to circuitry or electrical contacts disposed on the surface 12b of the substrate. The conductive vias in the openings, e.g., O1, O2, O3, O4 or O5 may be considered to be a part of the pillar 15.

An encapsulant 21 is disposed on the surface 12u of the substrate 12 and encapsulates the above-mentioned structure. In some embodiments, a metal layer 22 is formed on the surface 10b. A conductive component 23, e.g., a solder ball, is disposed on the metal layer 22. In some embodiments, the encapsulant 21 includes a molding compound. In some embodiments, the conductive component 23 includes solder, copper, silver or other metal alloy.

In some embodiments, a horizontal distance H1 between the electronic component 16 and the electronic component 20 is larger than a pad pitch D1 of the electronic component 11. In some embodiment, the horizontal distance H1 may be larger than 20 μm.

In some embodiments, the package structure 1 has a planar surface 1u. The surface 16u of the electronic component 16 and the surface 20u of the electronic component 20 are coplanar with the surface 1u.

In some embodiments, a thickness of the insulation layer 10 is in a range of 2 μm to 10 μm. In some embodiments, a thickness of the substrate (the inner dielectric layer) 12 is in a range of 20 μm to 100 μm. In some embodiments, a height of the pillar 15 is in a range of 20 μm to 50 μm. In some embodiments, a thickness of the electronic components 16 and 20 is in a range of 10 μm to 100 μm. In some embodiments, a diameter of the connection component 19 is in a range of 10 μm to 100 μm. In some embodiments, a thickness of the encapsulant 21 is in a range of 20 μm to 200 μm. In some embodiments, a diameter of the conductive component 23 is in a range of 80 μm to 300 μm.

Figure 2:
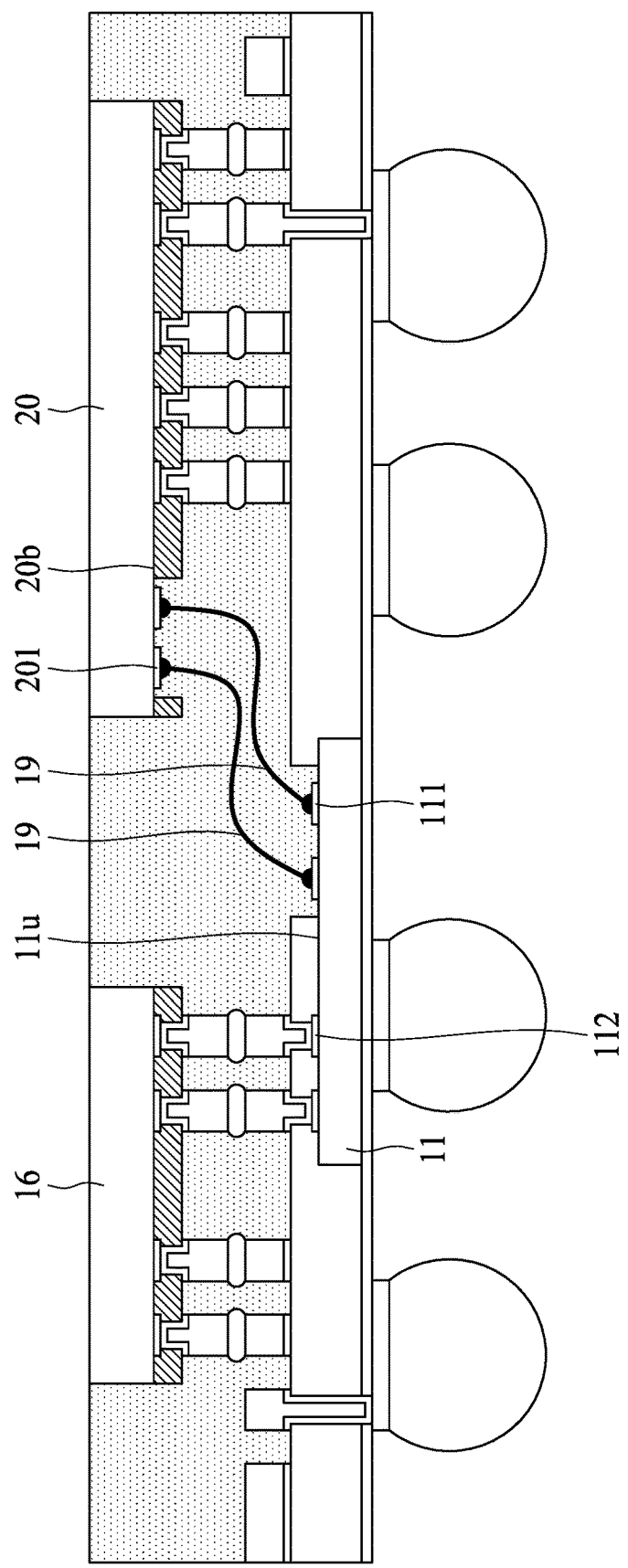
FIG. 2 illustrates a cross-sectional view of another package structure according to some embodiments of the present disclosure.

FIG. 2 illustrates a cross-sectional view of a package structure 2 according to some embodiments of the present disclosure. The package structure 2 of FIG. 2 has a similar structure to that of the package structure 1 of FIG. 1 except the configuration of the connection component 19. As shown in FIG. 2, the connection component 19 includes two bonding wires. The two bonding wires electrically connect the active surface 11u of the electronic component 11 and the active surface 20b of the electronic component 20.

Figure 3:
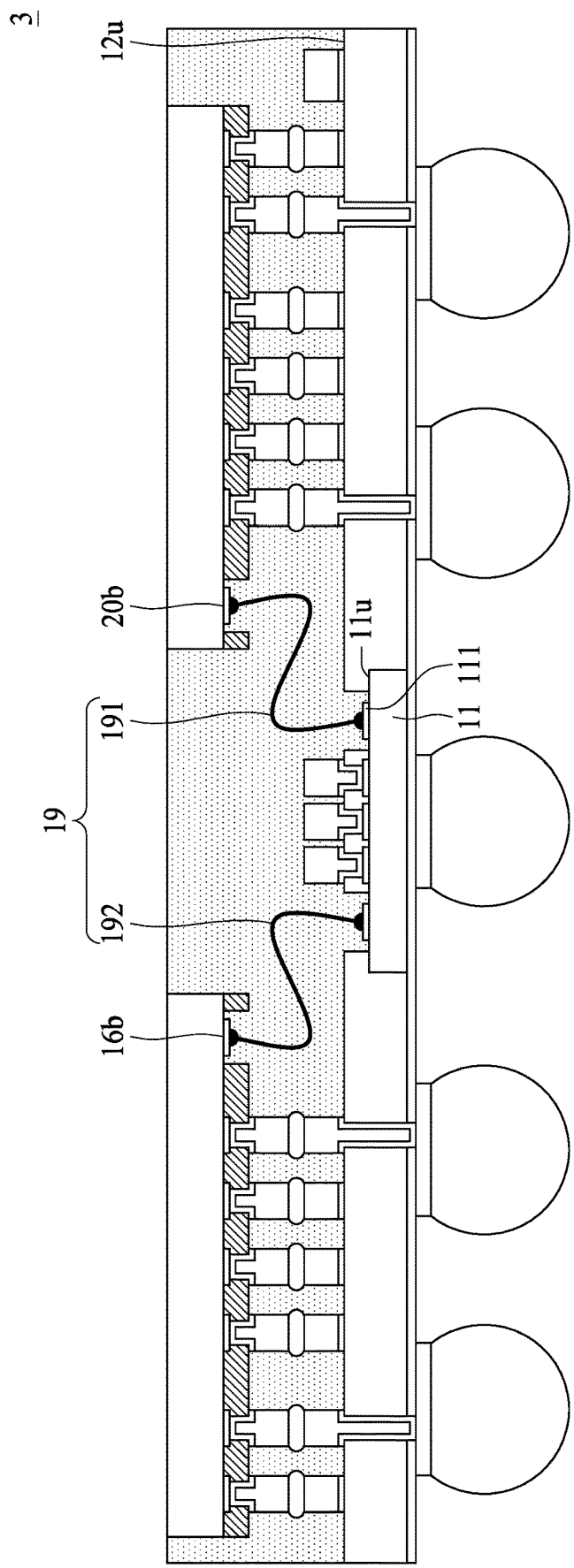
FIG. 3 illustrates a cross-sectional view of another package structure according to some embodiments of the present disclosure.

FIG. 3 illustrates a cross-sectional view of a package structure 3 according to some embodiments of the present disclosure. The package structure 3 of FIG. 3 has a similar structure to that of the package structure 1 of FIG. 1 except the configuration of the electronic component 11 and the connection component 19. As shown in FIG. 3, most of the active surface 11u of the electronic component 11 is exposed from the surface 12u of the substrate 12 except the periphery of the active surface 11u. The connection component 19 includes two bonding wires 191 and 192. The bonding wire 191 electrically connects the active surface 11u of the electronic component 11 and the active surface 20b of the electronic component 20. The bonding wire 192 electrically connects the active surface 11u of the electronic component 11 and the active surface 16b of the electronic component 16. Each of the bonding wires 191 and 192 has at least two bendings.

Figure 4:
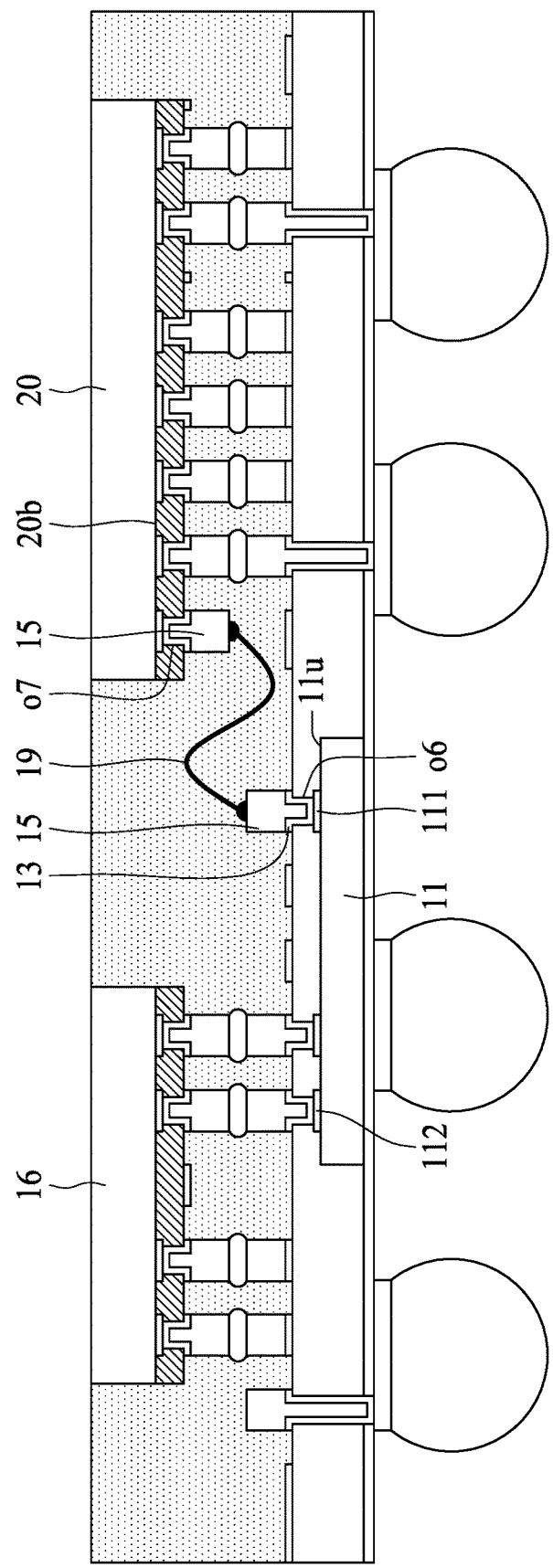
FIG. 4 illustrates a cross-sectional view of another package structure according to some embodiments of the present disclosure.

FIG. 4 illustrates a cross-sectional view of a package structure 4 according to some embodiments of the present disclosure. The package structure 4 of FIG. 4 has a similar structure to that of the package structure 1 of FIG. 1 except the configuration of the connection between the active surface 11u of the electronic component 11 and the active surface 20b of the electronic component 20. As shown in FIG. 4, a seed layer 13 is disposed in the openings O6 and O7 and conductive pillars 15 are disposed on the active surface 11u of the electronic component 11 and the active surface 20b of the electronic component 20 through the seed layer 13. The seed layer 13 can be considered as a part of the conductive pillar 15. An end of the connection component 19 connects the conductive pillar 15 on the active surface 11u and the other end of the connection component 19 connects the conductive pillars 15 on the active surface 20b. The connection component 19 electrically connects the electronic component 11 and the electronic component 20.

Figure 5:
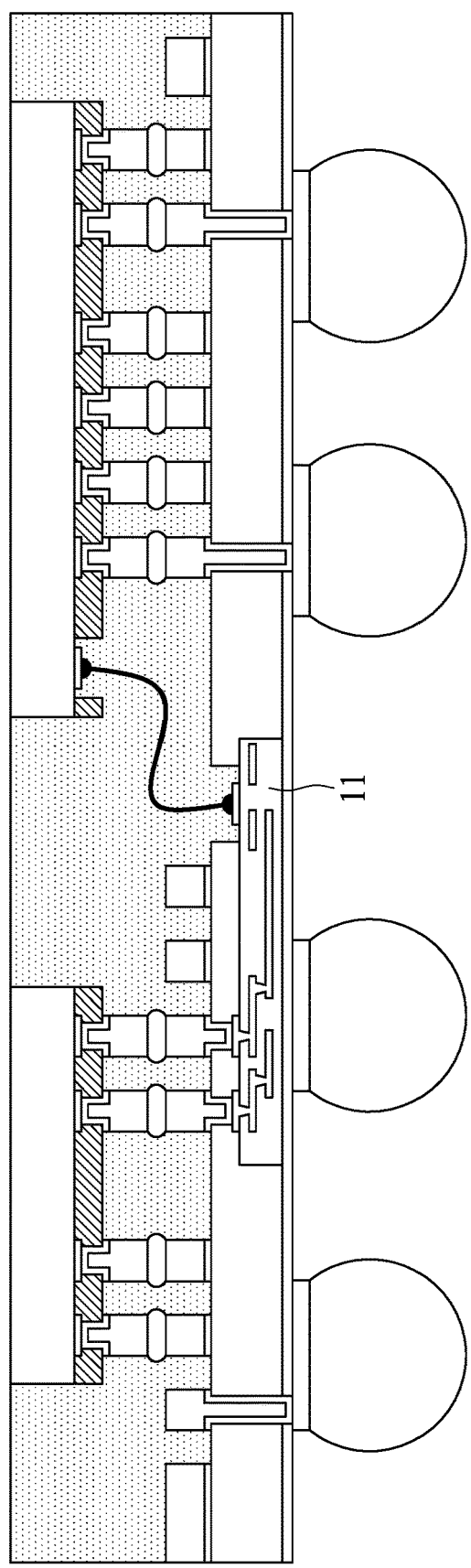
FIG. 5 illustrates a cross-sectional view of another package structure according to some embodiments of the present disclosure.

FIG. 5 illustrates a cross-sectional view of a package structure 5 according to some embodiments of the present disclosure. The package structure 5 of FIG. 5 has a similar structure to that of the package structure 1 of FIG. 1 except the configuration of the electronic component 11. As shown in FIG. 5, the electronic component 11 may include an RDL, a semiconductor substrate or a PCB.

Figure 6:
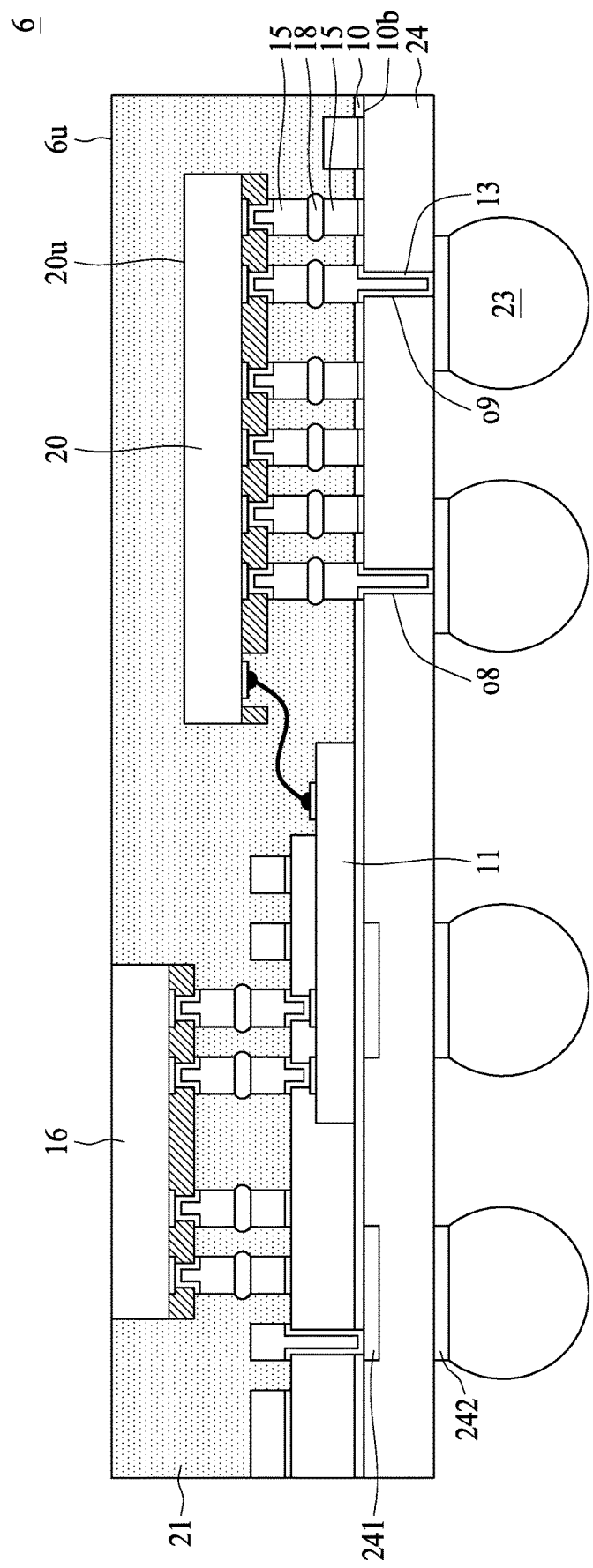
FIG. 6 illustrates a cross-sectional view of another package structure according to some embodiments of the present disclosure.
Figure 7:
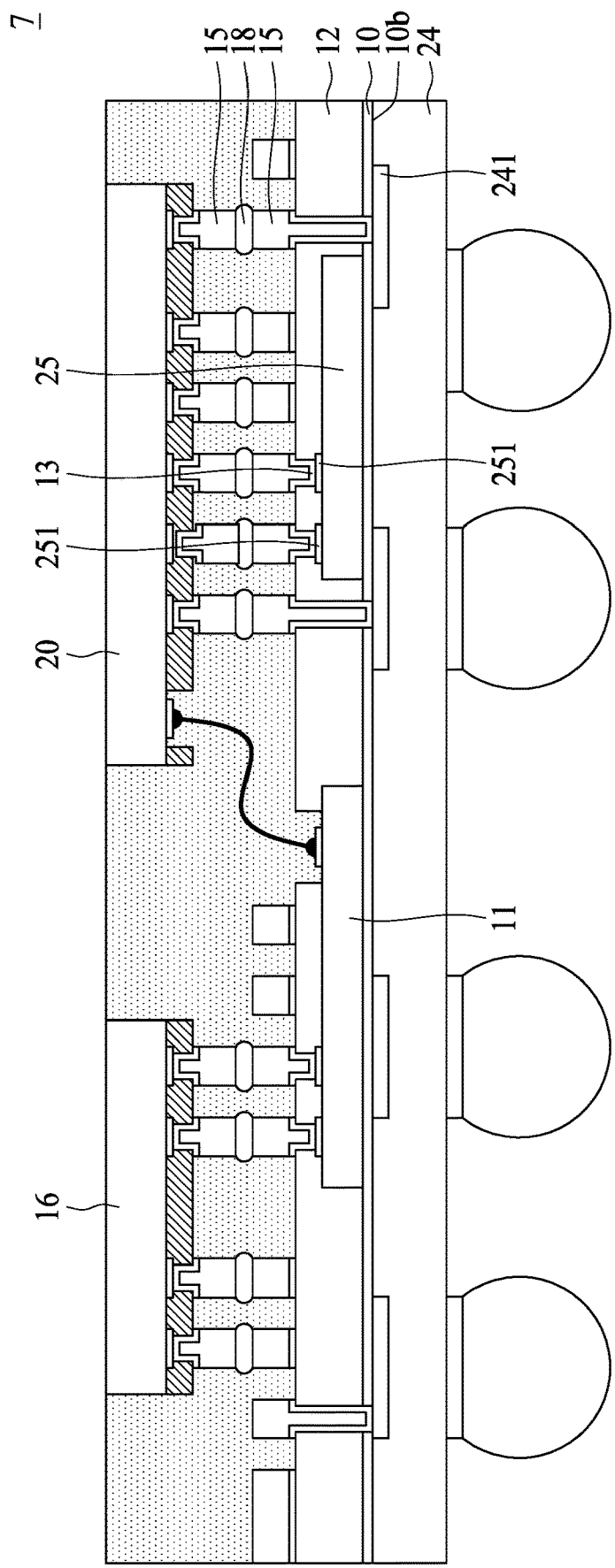
FIG. 7 illustrates a cross-sectional view of further package structure according to some embodiments of the present disclosure.
Figure 8:
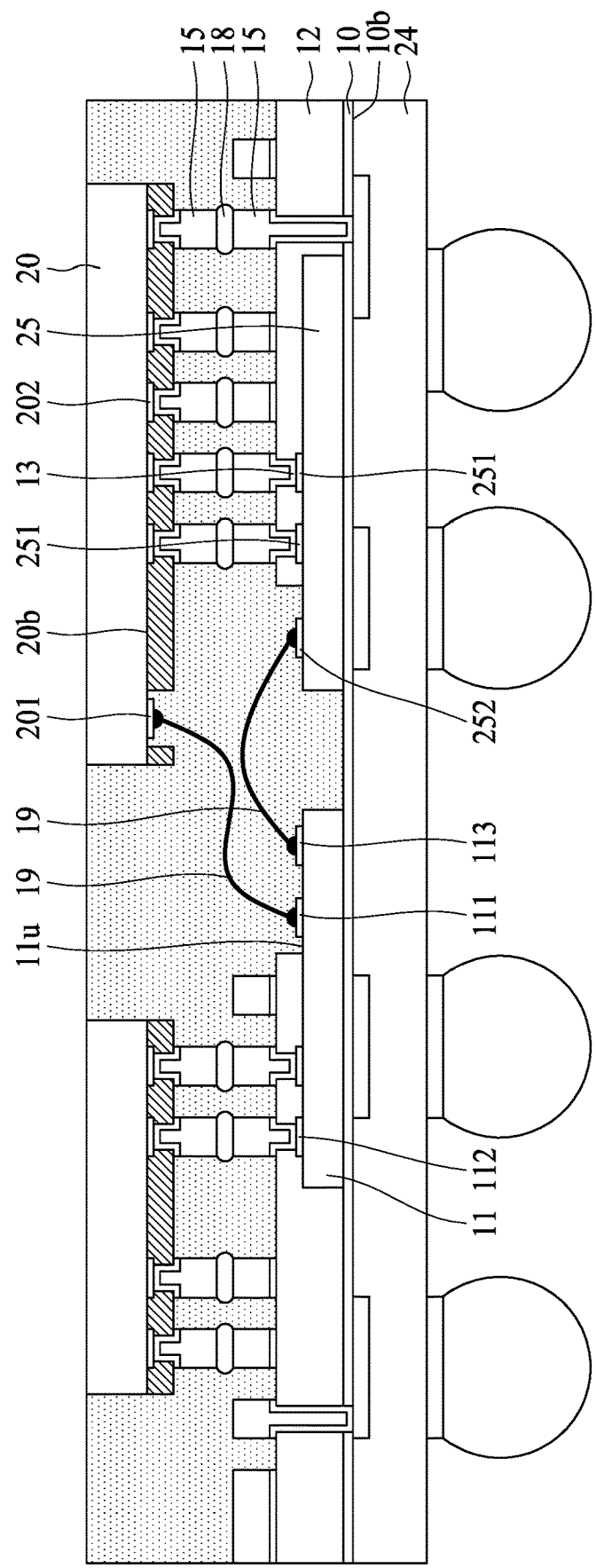
FIG. 8 illustrates a cross-sectional view of yet another package structure according to some embodiments of the present disclosure.

In some embodiments as illustrated in FIG. 6, FIG. 7 and FIG. 8, the package structure according to the present disclosure may include an RDL structure 24 disposed on the surface 10b of the insulation layer 10 to provide further electrical connection. The RDL structure 24 may be a semiconductor substrate or a PCB.

FIG. 6 illustrates a cross-sectional view of a package structure 6 according to some embodiments of the present disclosure. The package structure 6 of FIG. 6 has a similar structure to that of the package structure 1 of FIG. 1. The package structure 6 includes an RDL structure 24 disposed on the surface 10b of the insulation layer 10. Similar to the substrate 12, openings O8 and O9 may be formed in the RDL structure 24 and a seed layer 13 is disposed in the openings O8 and O9 so as to manufacture conductive vias to provide electrical connection. The conductive vias in the openings O8 and O9 may be considered to be a part of the pillar 15. The electronic component 20 may contact, or electrically connect to, the RDL structure 24, for example, through the pillar 15. The pillar 15 may contact, or electrically connect to, a conductive layer 241 or 242 of the RDL structure 24. In some embodiments, the surface 20u of the electronic component 20 may be covered by the encapsulant 21 so that the surface 20u of the electronic component 20 is not coplanar with a surface 6u of the package structure 6. In addition, the surface 20u of the electronic component 20 may be lower than or at the same height as the surface 16u of the electronic component 16.

FIG. 7 illustrates a cross-sectional view of a package structure 7 according to some embodiments of the present disclosure. The package structure 7 of FIG. 7 has a similar structure to that of the package structure 1 of FIG. 1 except that the package structure 7 includes an electronic component 25 and an RDL structure 24. The electronic component 25 may be disposed at the substrate 12 (e.g., fully embedded in the substrate 12) and has pads 251 electrically connected to the active surface of the electronic component 20 through the pillar 15. The RDL structure 24 is disposed on the surface 10b of the insulation layer 10.

FIG. 8 illustrates a cross-sectional view of a package structure 8 according to some embodiments of the present disclosure. The package structure 8 of FIG. 8 has a similar structure to that of the package structure 7 of FIG. 7 except that the electronic component 25 is not fully embedded in the substrate 12. A portion of the active surface of the electronic component 25 is not covered by the substrate 12 so that the pad 252 thereon can be exposed. As shown in FIG. 8, the electronic component 25 may be electrically connected to the electronic component 11. In some embodiments, the pad 113 of the electronic component 11 is exposed from the substrate 12 and connects to the exposed pad 252 of the electronic component 25, e.g., by a bonding wire 19 having only one bending.

Figure 9A:
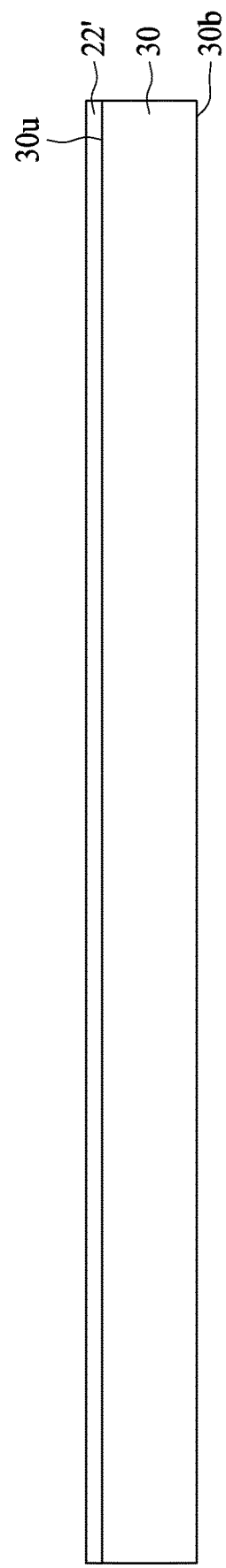
FIG. 9A, FIG. 9B, FIG. 9C, FIG. 9D, FIG. 9E, FIG. 9F, FIG. 9G, FIG. 9H, FIG. 9I, FIG. 9J, FIG. 9K, FIG. 9L, FIG. 9M, FIG. 9N, FIG. 9O, FIG. 9P, and FIG. 9Q illustrate various stages of a method of manufacturing a package structure according to some embodiments of the present disclosure.
Figure 9B:
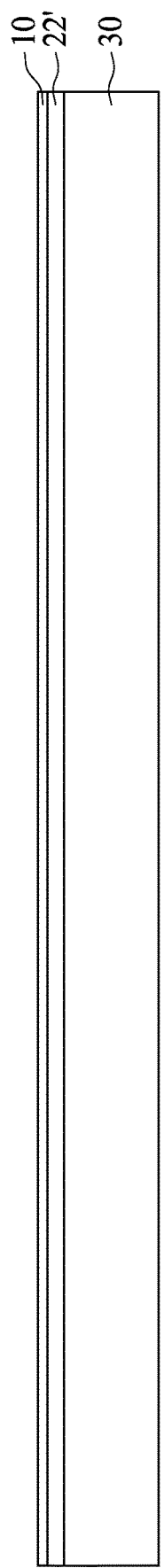
Figure 9C:
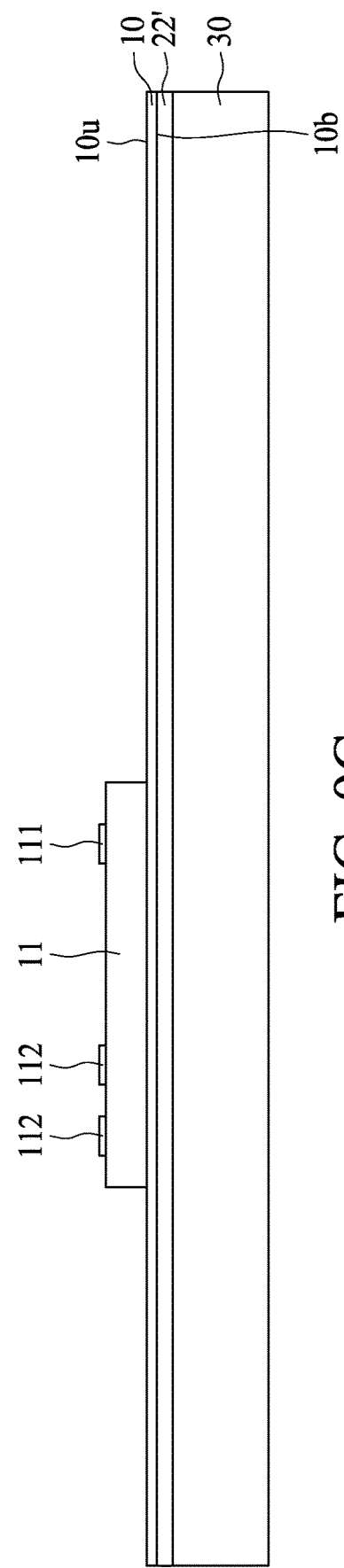
Figure 9D:
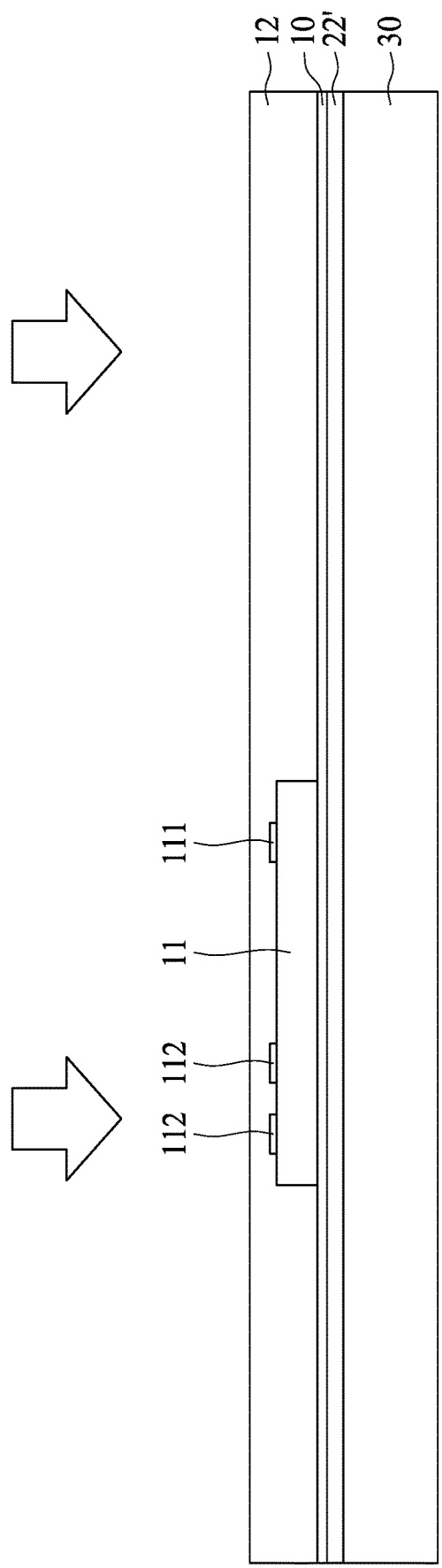
Figure 9E:
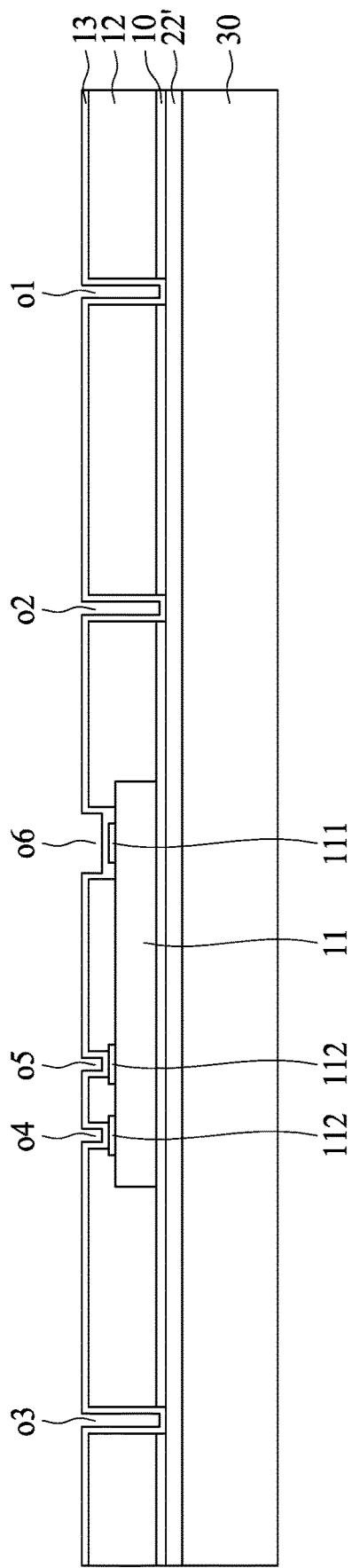
Figure 9F:
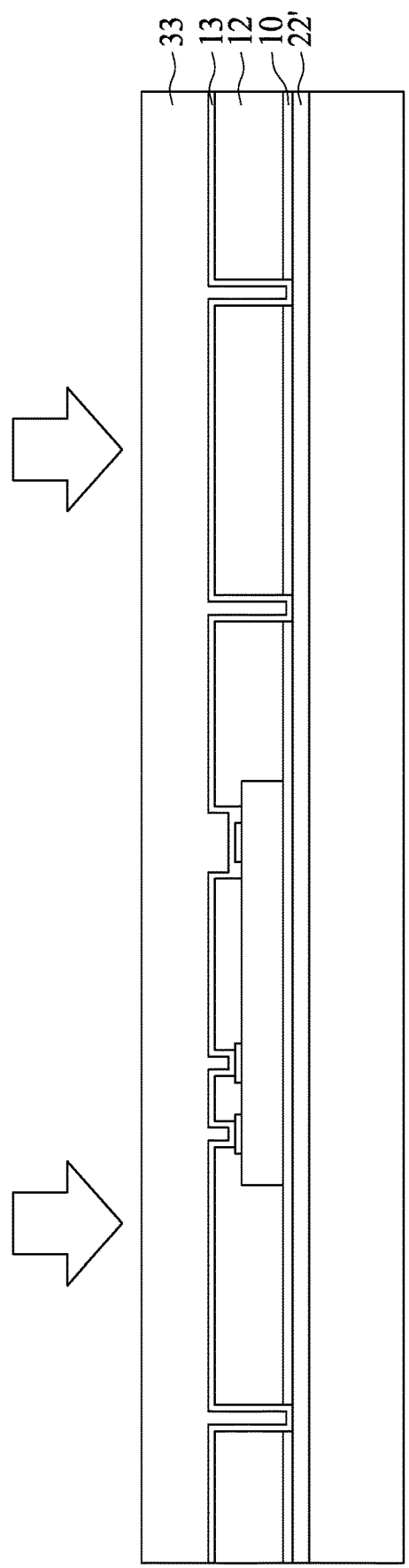
Figure 9G:
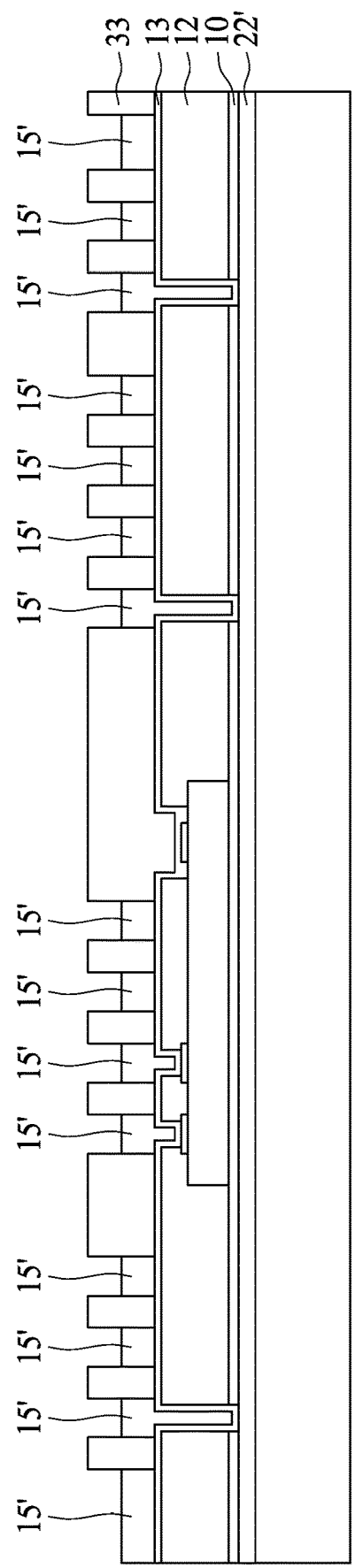
Figure 9H:
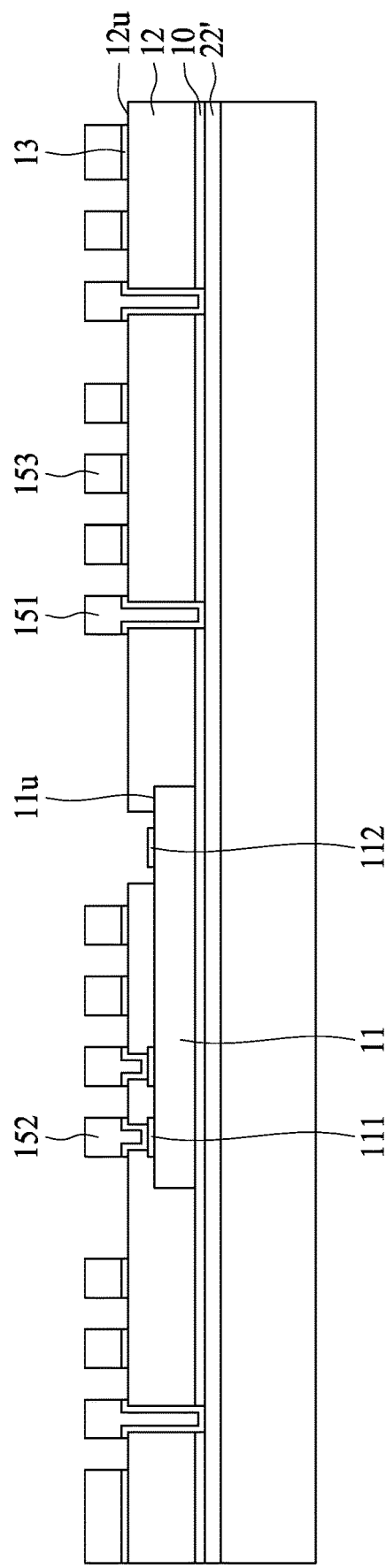
Figure 9I:
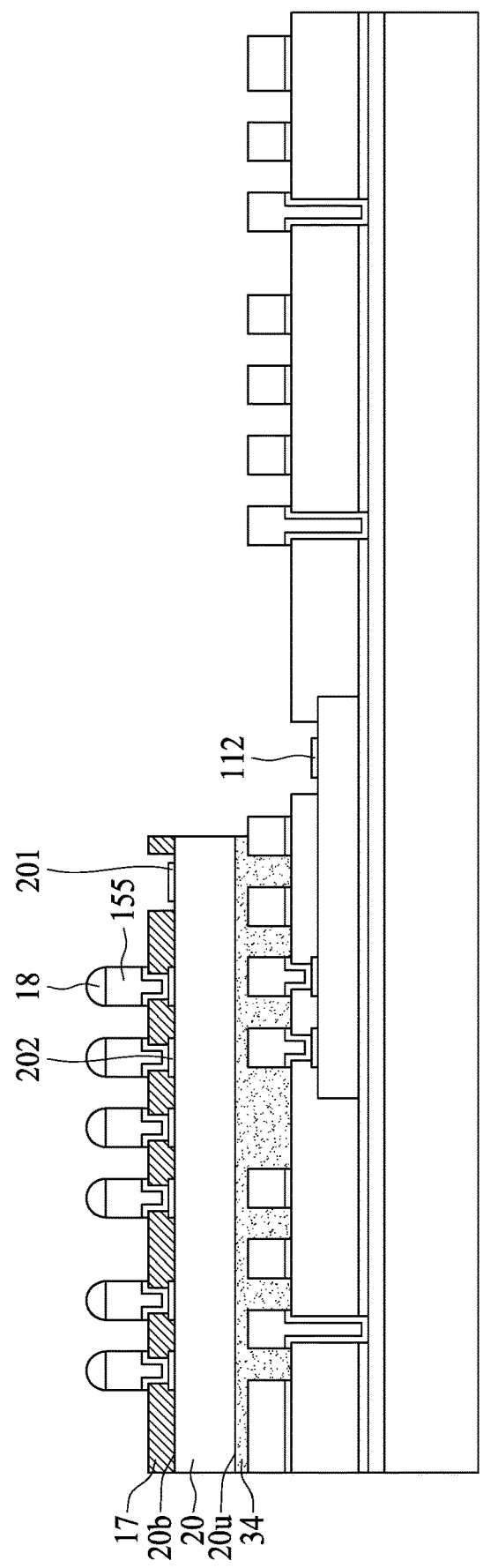
Figure 9J:
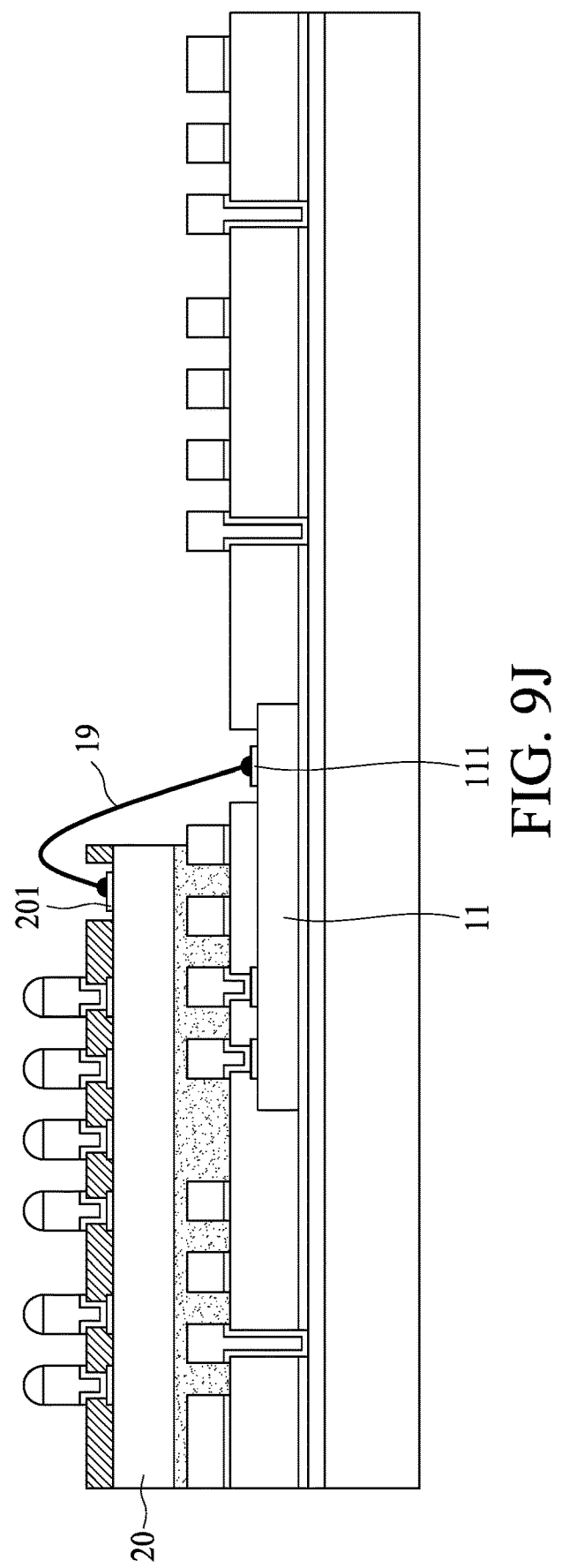
Figure 9K:
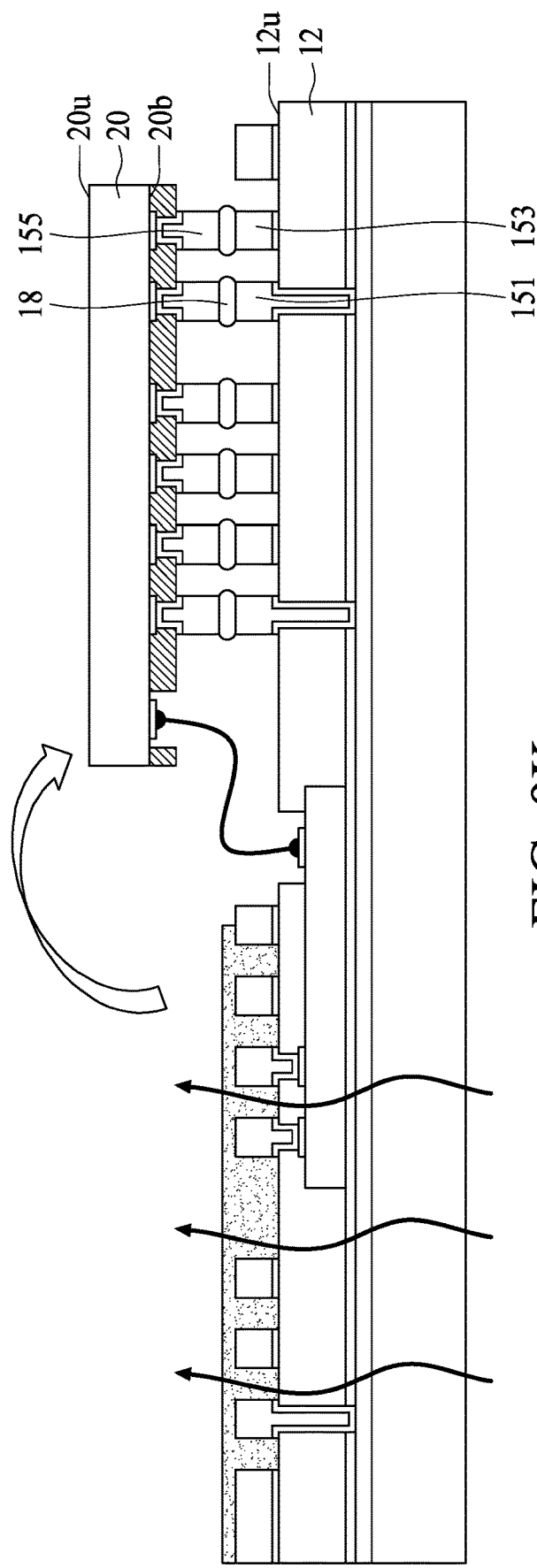
Figure 9L:
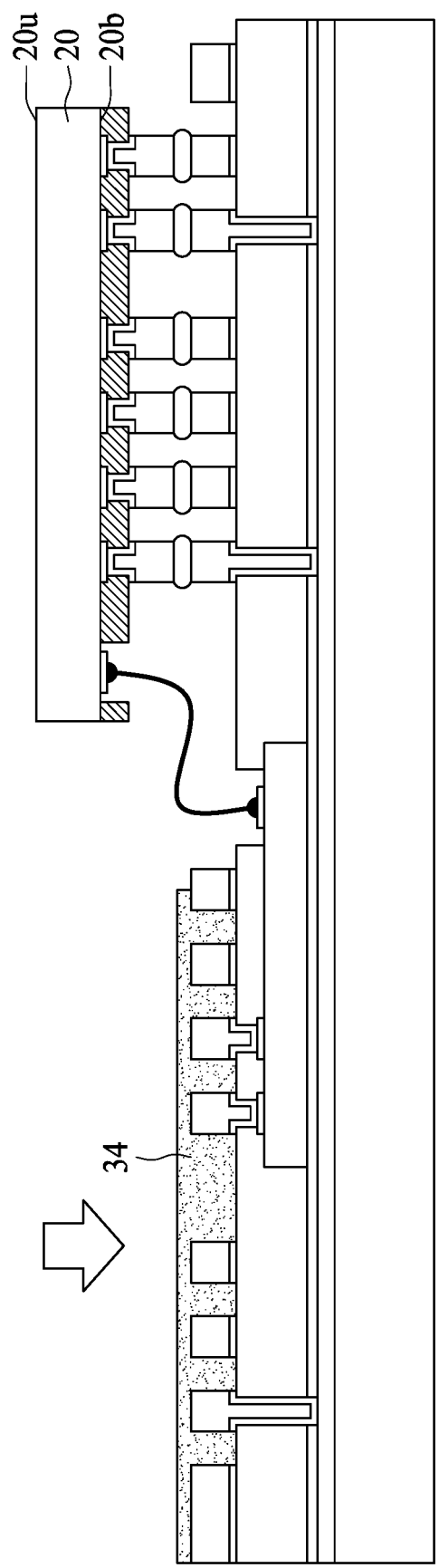
Figure 9M:
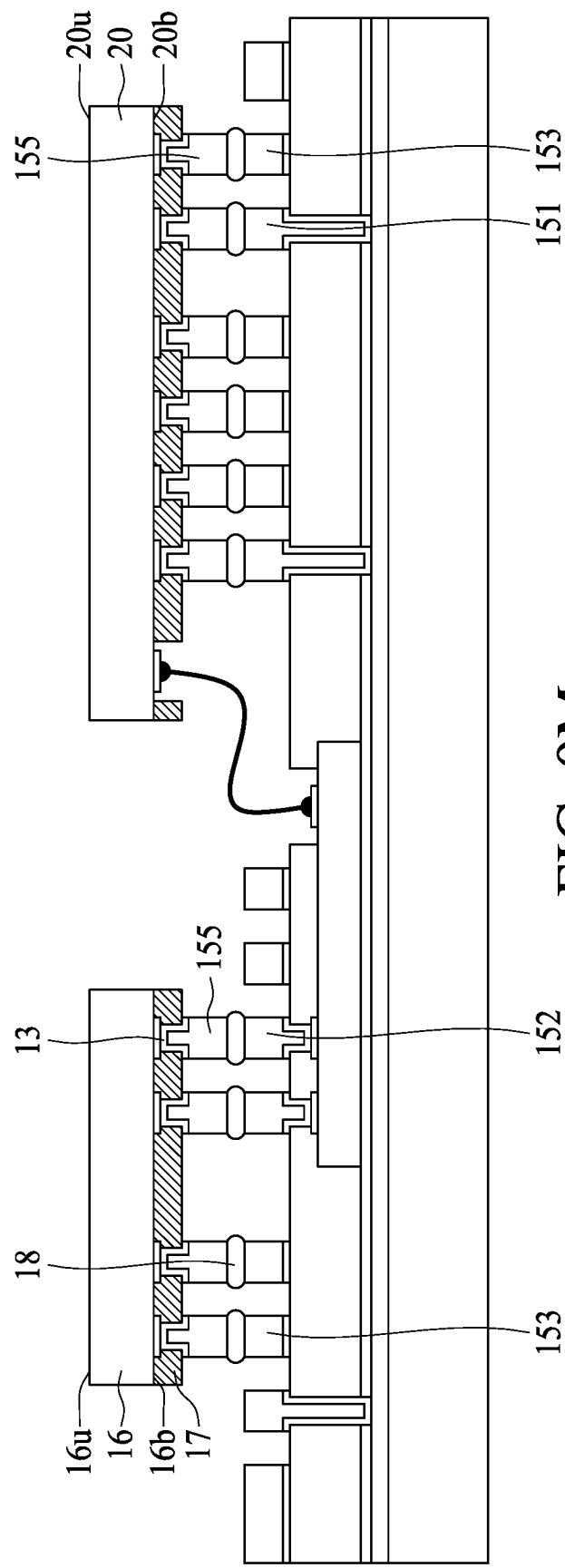
Figure 9N:
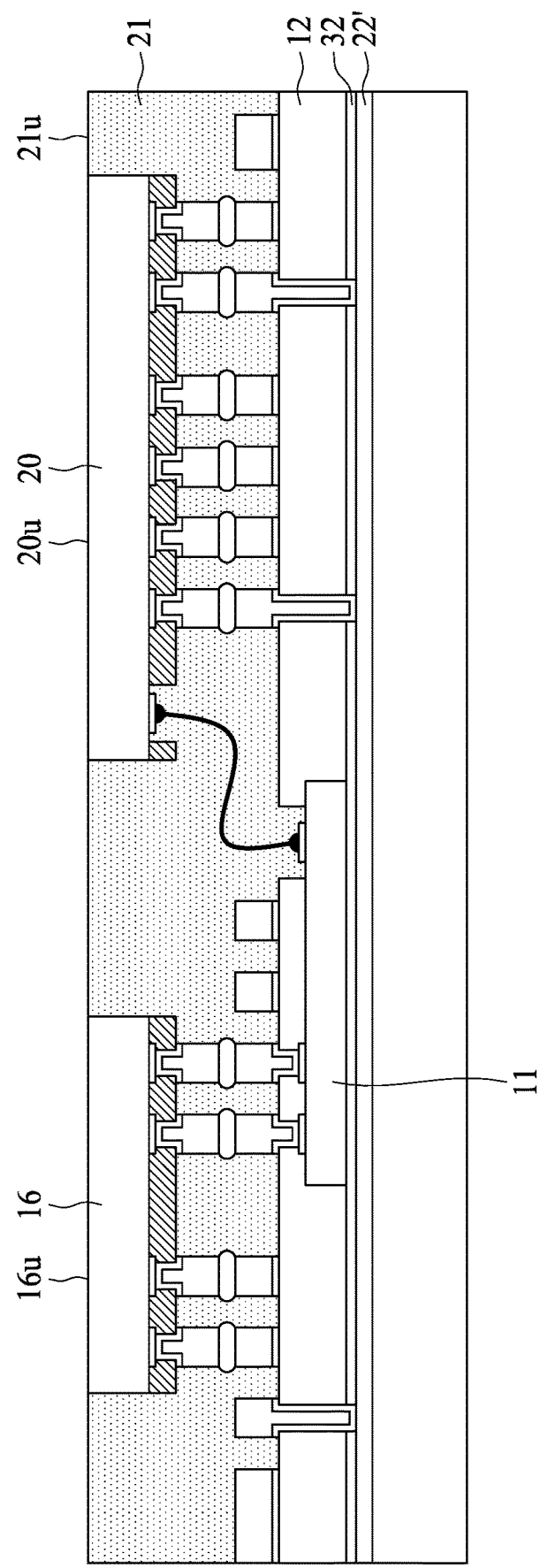
Figure 9O:
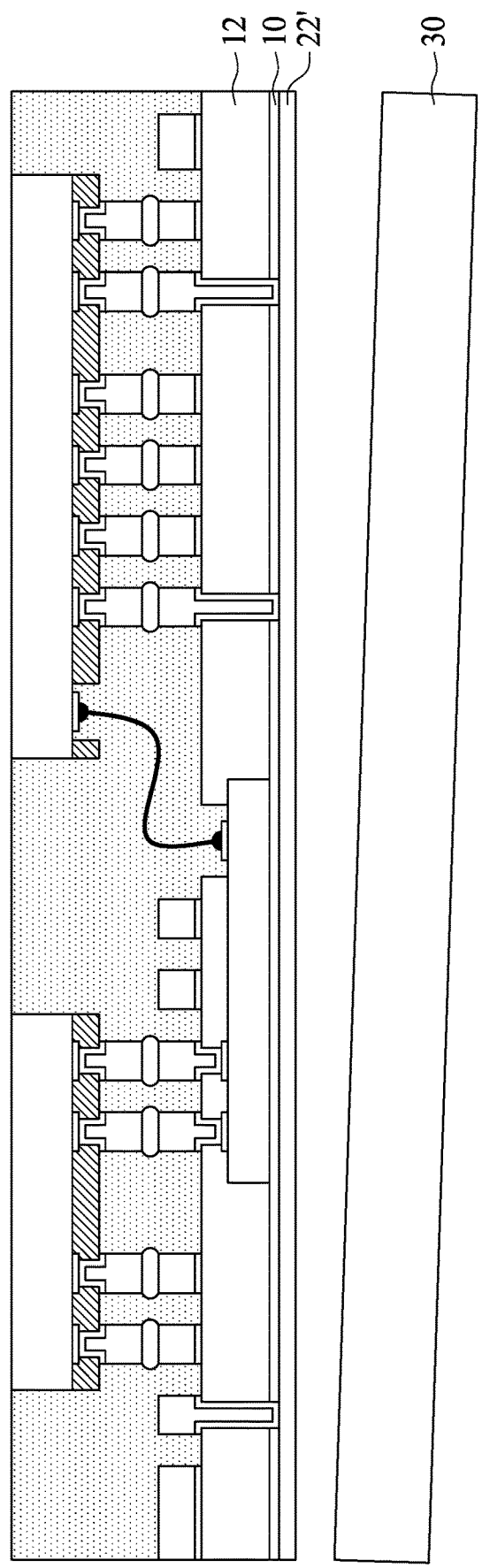
Figure 9P:
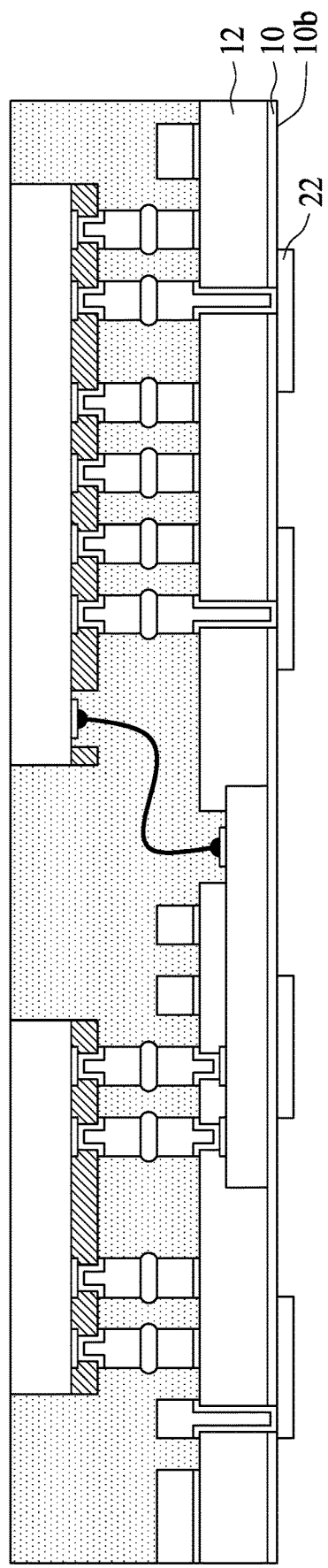
Figure 9Q:
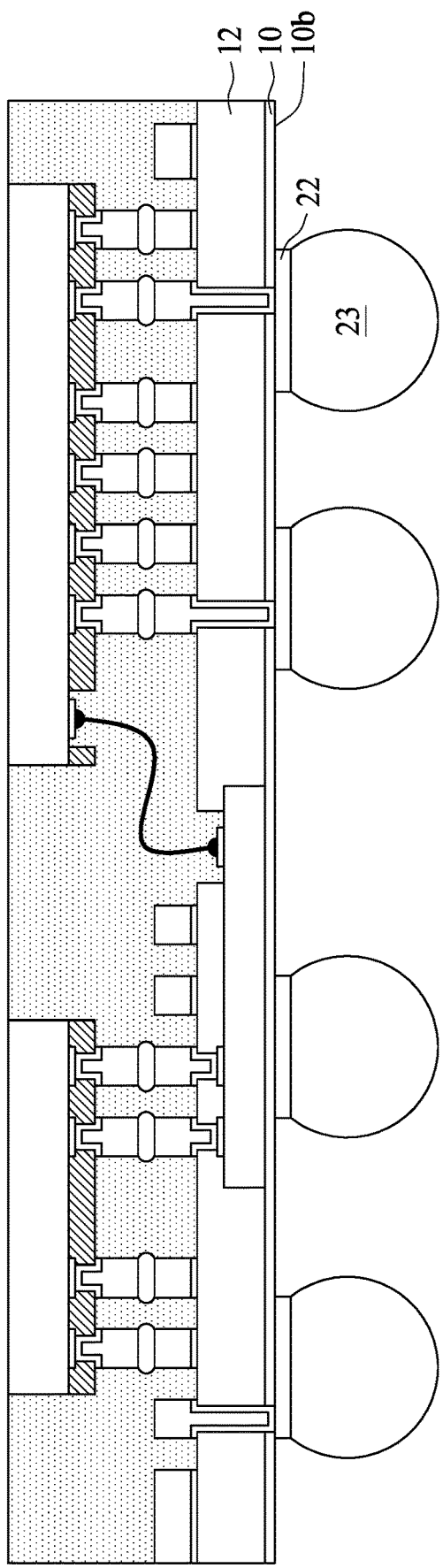

FIGS. 9A through 9Q illustrate various stages of a method of manufacturing the package structure 1 of FIG. 1.

Referring to FIG. 9A, a carrier 30 having a surface 30u and a surface 30b opposite to the surface 30u is provided. A metal layer 22' is formed on the surface 30u of the carrier 30.

Referring to FIG. 9B, a polyimide layer 10 is formed on the metal layer 22 as an insulation layer.

Referring to FIG. 9C, an electronic component 11 is disposed on a surface 10u of the polyimide layer 10. The electronic component 11 has a plurality of pads 111 and 112 thereon.

Referring to FIG. 9D, an inner dielectric layer 12 is formed on the structure as shown in FIG. 9C. Then a lithography process is performed to form openings as shown in FIG. 9E.

Referring to FIG. 9E, after the lithography process, openings O1 to O6 are formed. Openings O1 to O3 penetrate the inner dielectric layer 12 and the polyimide layer 10 and expose the metal layer 22'. Openings O4 to O6 penetrate the inner dielectric layer 12 and expose pads 111 and 112 of the electronic component 11. A seed layer 13 is formed on the inner dielectric layer 12 and in the openings O1 to O6.

Referring to FIG. 9F, a photoresist layer 33 is formed on the structure as shown in FIG. 9E. Then a lithography process is performed to form a patterned photoresist layer as shown in FIG. 9G.

Referring to FIG. 9G, after the lithography process, the photoresist layer 33 is patterned and a portion of the seed layer is exposed so that conductive vias, pillars and/or traces can be manufactured thereon in subsequent steps. A metal layer 15' is formed on the exposed seed layer, for example, by plating.

Referring to FIG. 9H, the photoresist layer 33 and the underlying seed layer 13 are removed, for example, by etching. After the removal of the photoresist layer 33 and the underlying seed layer 13, conductive pillars 151, 152 and 153 are formed. Conductive pillars 152 are electrically connected to the pads 111 of the electronic component 11. Conductive pillars 151 are electrically connected to the metal layer 22'.

Referring to FIG. 9I, an electronic component 20 having a surface 20u and a surface 20b opposite to the surface 20u is provided. The electronic component 20 includes pads 201 and 202 and an insulation layer 17 (e.g., a polyimide, a solder resist layer) on the surface 20b of the electronic component 20. The insulation layer 17 defines openings to expose the pads 201 and 202. Conductive pillars 15 are formed on the pads 202 and may include an adhesive layer 18 (e.g., solder paste) on a top surface of the conductive pillars 155. The surface 20u of the electronic component 20 is attached to the structure as shown in FIG. 9H through an adhesion layer 34 which is removable.

Referring to FIG. 9J, a bonding wire 19 is formed to connect the pad 201 of the electronic component 20 and the pad 111 of the electronic component 11.

Referring to FIG. 9K, the structure as shown in FIG. 9J is heated. The electronic component 20 is detached from the adhesion layer 34 and flipped as shown in FIG. 9J. The pillars 155 disposed on the surface 20b of the electronic component 20 are connected to the pillars 151 or 153 through the adhesive layer 18. The pillar 155 and the pillar 153 constitute the first portion and the second portion of the pillar 15 shown in FIG. 1. Similarly, the pillar 155 and the pillar 151 constitute the first portion and the second portion of the pillar 15. After flipping electronic component 20, the bonding wire 19 has two bendings.

Referring to FIG. 9L, chemical etching is applied to remove the adhesion layer 34.

Referring to FIG. 9M, the adhesion layer 34 is removed. An electronic component 16 is disposed on the structure as shown in FIG. 9L via flip chip bonding. The pillars 155 disposed on the surface 16b of the electronic component 16 are connected to the pillars 152 or 153 through the adhesive layer 18. The pillar 155 and the pillar 153 constitute the first portion and the second portion of the pillar 15 shown in FIG. 1. Similarly, the pillar 155 and the pillar 152 constitute the first portion and the second portion of the pillar 15.

Referring to FIG. 9N, an encapsulant 21 is applied to encapsulate the structure as shown in FIG. 9M. The encapsulant 21 encapsulates the inner dielectric layer 12, the electronic component 11, the electronic component 16 and the electronic component 20. In some embodiment, the surface 21u of the encapsulant 21 is coplanar with a surface 16u of the electronic component 16 and a surface 20u of the electronic component 20 which may be achieved, for example, by carrying out a grinding process.

Referring to FIG. 9O, the carrier 30 is removed from the structure as shown in FIG. 9N.

Referring to FIG. 9P, a lithography process is carried out so that the metal layer 22' is patterned and forms a patterned metal layer 22.

Referring to FIG. 9Q, Conductive components 23 (e.g., solder balls) are formed on the patterned metal layer 22.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
a substrate;
a first electronic component adjacent to the substrate and having a first active surface;
a second electronic component having a second active surface facing the first active surface of the first electronic component wherein the second electronic component is electrically connected to the first electronic component;
a third electronic component having a third active surface facing the substrate; and
a connection component electrically connecting the third active surface of the third electronic component to the first active surface of the first electronic component, wherein the connection component has at least two bendings.

2. The package structure of claim 1, wherein the connection component comprises a redistribution layer (RDL).

3. The package structure of claim 1, wherein the first electronic component comprises a plurality of pads on the first active surface of the first electronic component and wherein a horizontal distance between the second electronic component and the third electronic component is larger than a pad pitch of the first electronic component.

4. The package structure of claim 1, wherein the third electronic component is connected to the substrate by a copper pillar.

5. The package structure of claim 1, wherein the connection component comprises at least one bonding wire, the at least one bonding wire connects the first active surface of the first electronic component to the second active surface of the second electronic component.

6. The package structure of claim 1, wherein the substrate having a first surface and a second surface opposite the first surface, the first active surface of the first electronic component is exposed from the second surface of the substrate, and the package structure further comprises an insulation layer disposed on the first surface of the substrate.

7. The package structure of claim 6, wherein the insulation layer includes polyimides.

8. The package structure of claim 1, wherein the substrate comprises an inner dielectric layer covering the first electronic component.

9. The package structure of claim 1, wherein the second active surface of the second electronic component is electrically connected to the first active surface of the first electronic component through a copper pillar.

10. The package structure of claim 1, wherein the second active surface of the second electronic component is electrically connected to the first active surface of the first electronic component through a further connection component and wherein the further connection component has at least two bendings.

11. The package structure of claim 1, wherein the connection component is connected to a pad, a bump or a pillar disposed on the first active surface of the first electronic component and a pad, a bump or a pillar disposed on the third active surface of the third electronic component.

12. The package structure of claim 1, wherein the first electronic component comprises a bridge die, an RDL, a semiconductor substrate or a PCB.

13. A package structure, comprising:
a substrate;
a first electronic component adjacent to the substrate and having a first active surface exposed from the substrate and a lateral surface non-coplanar with the first active surface;
a second electronic component having a second active surface facing the substrate and electrically connected to the first active surface of the first electronic component;
a third electronic component having a third active surface facing the substrate; and
a connection component electrically connecting the third active surface of the third electronic component to the first active surface of the first electronic component, wherein a projection of the connection component on the substrate overlaps the lateral surface of the first electronic component.

14. The package structure of claim 13, wherein the connection component comprises at least one bonding wire or a redistribution layer (RDL).

15. The package structure of claim 13, wherein the third electronic component is connected to the substrate by a copper pillar.

16. The package structure of claim 13, wherein the substrate comprises an inner dielectric layer covering the first electronic component.

17. The package structure of claim 13, wherein the second active surface of the second electronic component is electrically connected to the first active surface of the first electronic component through a further connection component.

18. The package structure of claim 13, wherein the first electronic component comprises a plurality of pads on the first active surface of the first electronic component and wherein a horizontal distance between the second electronic component and the third electronic component is larger than a pad pitch of the first electronic component.

19. A method for manufacturing a package structure, comprising:
providing a substrate, wherein the substrate comprises a first electronic component having a first active surface exposed from the substrate;
disposing a second electronic component on the substrate, wherein the second electronic component has a second active surface facing away from the substrate;
connecting the second active surface of the second electronic component and the first active surface of the first electronic component using a bonding wire; and
flipping the second electronic component and electrically connecting the second electronic component to the substrate.

20. The method of claim 19, further comprising:
disposing a third electronic component on the substrate, wherein the third electronic component has a third active surface facing the first active surface of the first electronic component and electrically connected to the first active surface of the first electronic component; and
disposing an encapsulant encapsulating the substrate, the first electronic component, the second electronic component and the third electronic component.

* * * * *